(12) United States Patent
Warnaar et al.

(10) Patent No.: US 8,130,366 B2
(45) Date of Patent: Mar. 6, 2012

(54) METHOD FOR COARSE WAFER ALIGNMENT IN A LITHOGRAPHIC APPARATUS

(75) Inventors: Patrick Warnaar, Tilburg (NL); Franciscus Godefridus Casper Bijnen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 578 days.

(21) Appl. No.: 12/395,091

(22) Filed: Feb. 27, 2009

(65) Prior Publication Data
US 2009/0237637 A1 Sep. 24, 2009

Related U.S. Application Data

(60) Provisional application No. 61/064,719, filed on Mar. 21, 2008.

(51) Int. Cl.
*G01B 11/00* (2006.01)
*G03B 27/32* (2006.01)
*G03B 27/42* (2006.01)
*G03B 27/54* (2006.01)
*G03B 27/74* (2006.01)

(52) U.S. Cl. ............ 355/77; 355/53; 355/67; 355/68; 356/400

(58) Field of Classification Search .......... 250/548, 250/550, 559.01, 559.03–559.04; 355/52–53, 355/55, 67–68, 77; 356/399–401, 490, 508–509; 382/151; 430/22
See application file for complete search history.

(56) References Cited

U.S. PATENT DOCUMENTS
6,097,473 A * 8/2000 Ota et al. ............. 355/53
(Continued)

FOREIGN PATENT DOCUMENTS
EP 1372040 A2 12/2003
(Continued)

OTHER PUBLICATIONS

Office Action in related Japanese Patent Application 2009-064811 mailed Aug. 23, 2011.
(Continued)

*Primary Examiner* — Hung Henry Nguyen
*Assistant Examiner* — Colin Kreutzer
(74) *Attorney, Agent, or Firm* — Pillsbury Winthrop Shaw Pittman LLP

(57) ABSTRACT

A method for alignment of a substrate, in which the substrate includes a mark in a scribe lane, and the scribe lane extends along a longitudinal direction as a first direction. The mark has a periodic structure in the first direction. The method includes providing an illumination beam for scanning the mark in a direction perpendicular to a direction of the mark's periodic structure along a first scan path across the mark, scanning the spot of the illumination beam along a second scan path across the mark, the second scan path being parallel to the first scan path, wherein the second scan path is shifted relative to the first scan path over a first shift that corresponds to a fraction of the repeating distance of the periodic structure.

15 Claims, 5 Drawing Sheets

U.S. PATENT DOCUMENTS

| | | | |
|---|---|---|---|
| 2006/0061743 | A1 | 3/2006 | Den Boef et al. |
| 2007/0132996 | A1 | 6/2007 | Van Haren et al. |
| 2007/0222960 | A1 | 9/2007 | Van Der Schaar et al. |

FOREIGN PATENT DOCUMENTS

| | | | |
|---|---|---|---|
| JP | 2006-114919 A | 4/2006 | |

OTHER PUBLICATIONS

Office Action in related Korean Patent Application 10-2009-0023966 mailed Sep. 21, 2011.

Search Report and Written Opinion in related Singapore patent application No. 200901815-1 mailed Nov. 23, 2010.

* cited by examiner

METHOD FOR COARSE WAFER ALIGNMENT IN A LITHOGRAPHIC APPARATUS

FIELD

The present invention relates to a method for coarse wafer alignment in a lithographic apparatus. Also, the present invention relates to a method for manufacturing semiconductor devices. Furthermore, the present invention relates to a lithographic apparatus and to a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, target portions on the substrate are separated by a scribe lane, in which one or more marks are located. For coarse optical alignment of a wafer in a lithographic apparatus, an optical alignment scan is performed along a scan path across the scribe lane over such a mark (thus scan data is also gathered outside the scribe lane). The optical alignment scan is based on so-called self-referencing interferometry to obtain a scan data signal from a mark. Such a mark typically comprises three parallel lines that extend in a longitudinal direction of the scribe lane and that are spaced apart from each other in a width direction of the scribe lane. A pitch between each pair of lines in the mark is different from a pitch between an other pair.

The used self-referencing interferometry has been described in EP 1372040. The position of the mark can be obtained by searching in the scan data signal for a signal portion that matches the two pitches of the mark-design, for example by a pattern recognition procedure. The location of the matching signal portion in the scan data signal relates to the position of the mark within the scan path.

It is observed that product structures, next to the mark and outside the scribe lane, may cause interference with the signal generated by the mark. The interference may cause inaccuracy in the pattern recognition and result in a misalignment.

Moreover, because any device structure (product structure) next to the mark will cause interference with the mark itself, this will disturb the alignment performance. Therefore, the mark has an exclusion zone which will be left empty without device structure. For that reason the scribe lane typically does not have a width below a minimal value. To reduce the width of the scribe lane may lead to a less accurate coarse alignment result and is therefore undesirable when using a coarse alignment method in accordance with the prior art.

SUMMARY

It is desirable to have a method which overcomes one or more of the disadvantages of the prior art.

According to an aspect, there is provided a method for alignment of a substrate, the substrate comprising a mark in a scribe lane, the scribe lane extending along a longitudinal direction as a first direction,
the mark having a periodic structure in the first direction and
  a mark structure extending in a second direction perpendicular to the first direction, the periodic structure having a
  repeating distance in the first direction;
the method comprising:
  providing an illumination beam for scanning the mark in
    the second direction;
  scanning a spot of the illumination beam in the second
    direction along a first scan path across the mark;
  scanning the spot of the illumination beam in the second
    direction along a second scan path across the mark, the
    second scan path being parallel to the first scan path,
wherein the second scan path is shifted along the first direction relative to the first scan path over a first shift, the first
  shift corresponding to a fraction of the repeating distance
  of the periodic structure in the first direction.

According to an aspect, there is provided a lithographic apparatus comprising:
  a substrate table constructed to hold a substrate, the substrate comprising a mark in a scribe lane, the scribe lane
    extending along a longitudinal direction as a first direction,
the mark having a periodic structure in the first direction and
  a mark structure extending in a second direction perpendicular to the first direction, the periodic structure having a
  repeating distance in the first direction;
  a scanning device for providing an illumination beam for
    scanning the mark in the second direction;
  a control system coupled to the substrate table and the
    scanning device for controlling an action of the substrate
    table and the scanning device, respectively, wherein the
    control system is configured to control:
  providing an illumination beam for scanning the mark in
    the second direction;
  scanning a spot of the illumination beam in the second
    direction along a first scan path across the mark;
  scanning the spot of the illumination beam in the second
    direction along a second scan path across the mark, the
    second scan path being parallel to the first scan path,
wherein the second scan path is shifted along the first direction relative to the first scan path over a first shift, the first
  shift corresponding to a fraction of the repeating distance
  of the periodic structure in the first direction.

According to an aspect, there is provided a computer program to be loaded by a computer, the computer comprising a processor, memory, the memory being connected to the processor, the computer being part of a lithographic apparatus, the lithographic apparatus comprising:
  a substrate table constructed to hold a substrate, the substrate comprising a mark in a scribe lane, the scribe lane
    extending along a longitudinal direction as a first direction, the mark having a periodic structure in the first
    direction and a mark structure extending in a second
    direction perpendicular to the first direction, the periodic
    structure having a repeating distance in the first direction;

a scanning device for providing an illumination beam for scanning the mark in the second direction;

the computer being arranged as a control system coupled to the substrate table and the scanning device for controlling actions of the substrate table and the scanning device, respectively;

the computer program after being loaded allowing the processor to carry out:

providing an illumination beam for scanning the mark in the second direction;

scanning a spot of the illumination beam in the second direction along a first scan path across the mark;

scanning the spot of the illumination beam in the second direction along a second scan path across the mark, the second scan path being parallel to the first scan path, wherein the second scan path is shifted along the first direction relative to the first scan path over a first shift, the first shift corresponding to a fraction of the repeating distance of the periodic structure in the first direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
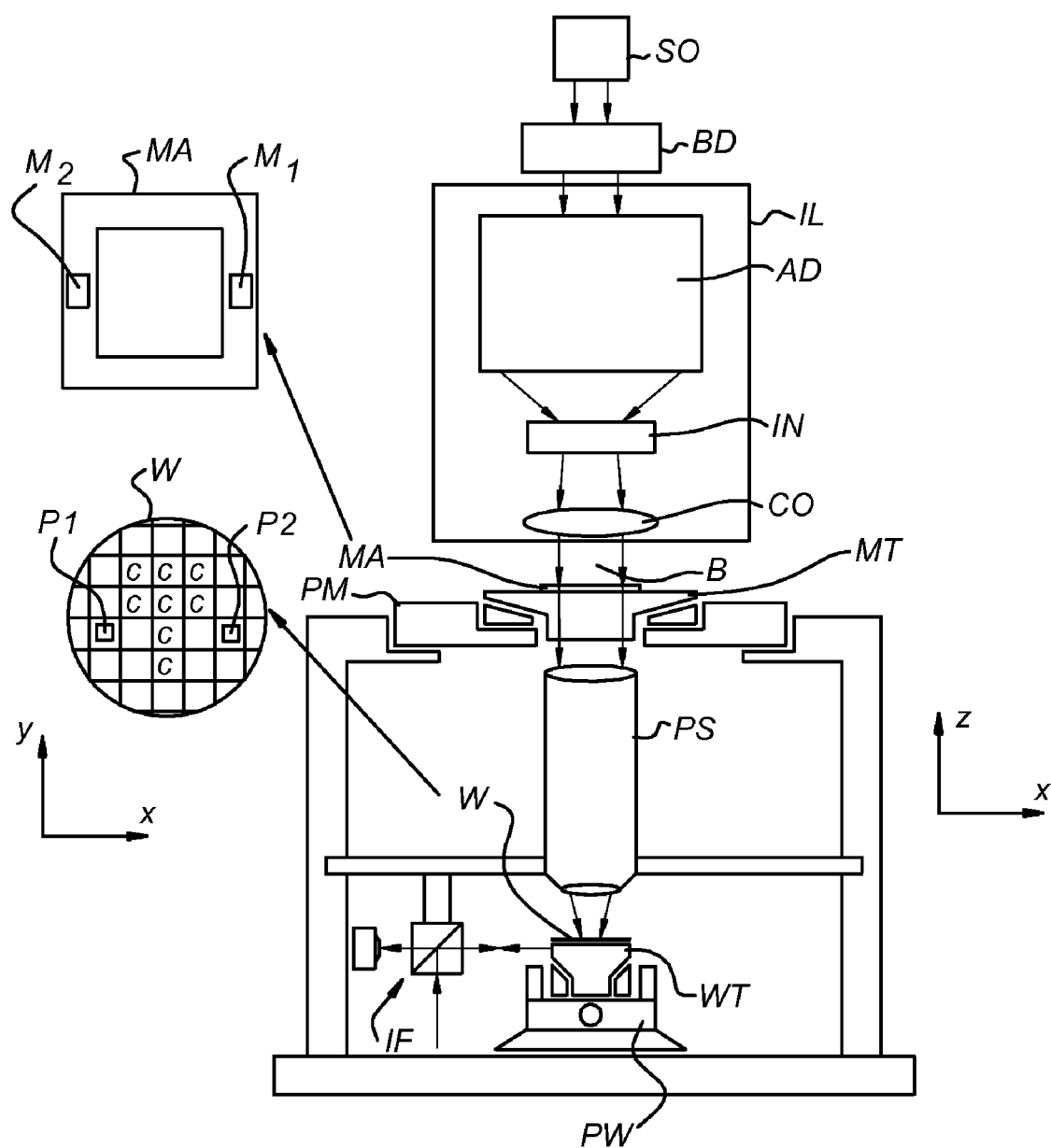
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g., UV radiation or EUV radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
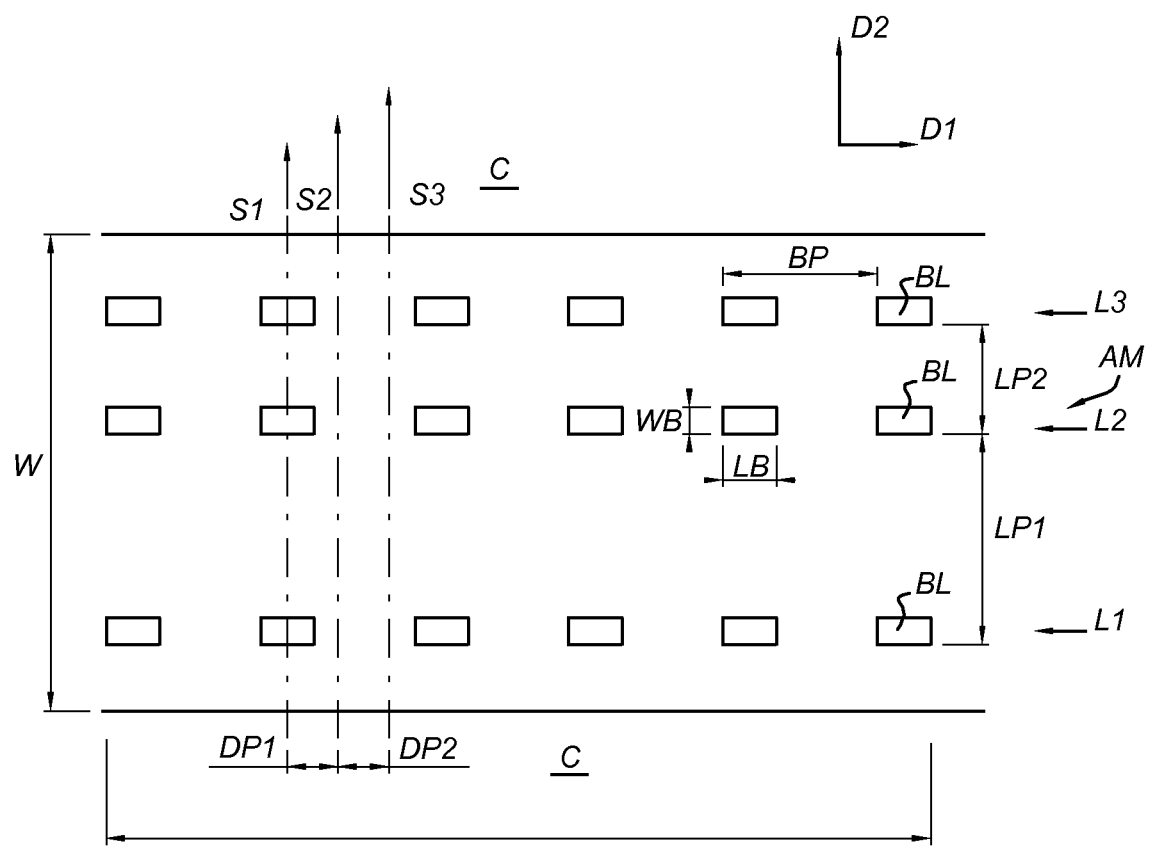
FIG. 2 depicts a top view of a mark for coarse alignment for illustration of the method according to the present invention.

FIG. 2 depicts a top view of a mark for coarse alignment for illustration of the method according to a first embodiment of the present invention.

Mark AM is arranged on a semiconductor wafer in a scribe line SL that is intermediate two target portions C. The scribe line SL extends longitudinally in a first direction D1, and has a width W in a second direction D2 perpendicular to the first direction D1.

The mark AM comprises a periodic structure in the first direction and a mark structure extending in the second direction perpendicular to the first direction. The mark comprises three block lines M1, M2, M3 which are ranked parallel to each other and extend in the first direction D1 of the scribe line SL. The three block lines M1 . . . M3 have a length L.

The three block lines M1 . . . M3 are separated from each other by two interspaces in the second direction which define the mark structure in the second direction. The first block line M1 and the second block line M2 are spaced apart by a first interspace with a first pitch LP1, the second block line M2 and the third block line M3 are spaced apart by a second interspace with a second pitch LP2. Each interspace has a pitch different from the pitch of another interspace. It is noted that a mark may comprise more than three block lines parallel to each other.

In FIG. 2 the block lines M1 . . . M3 are each divided in blocks in a substantially identical manner. Each block line M1, M2, M3 comprises a plurality of blocks BL which are spaced apart in the first direction D1 by a block pitch BP as periodic structure. Each block BL has a block length LB and a block width WB. The block pitch provides the repeating distance of the periodic structure in the first direction.

In an exemplary mark AM, the width W of the scribe lane SL is 60 µm, the first pitch LP1 is 16 µm, the second pitch LP2 is 21 µm, the block pitch BP is 8 µm, the block length LB is 4 µm and the block width WB is 3 µm.

During an optical alignment scan, an illumination beam of a self referencing interferometer is provided as a spot on the substrate, for illuminating the mark AM. The self referencing interferometer uses at least four laser beams, each having a respective wavelength in the range between about 530 and about 850 nm and different from the wavelength of the other laser beams. Further the self-referencing interferometer is arranged for scanning the spot of the illumination beam over the mark in the scribe lane as described in more detail below. Also, the self-referencing interferometer is arranged for registering an interferometry signal obtained during the scan across the mark.

Due to the characteristics of the self-referencing interferometer, during the optical alignment scan, local intensity minima in the interferometry signal are obtained at scan positions associated with positions of each of the M1 ... M3 in the mark and at interferences of the lines M1 ... M3.

The mark is arranged for producing an optical interference pattern during the optical alignment scan in which the optical interference pattern displays a number of individual local intensity minima.

The method according to the present invention is illustrated by dashed lines S1, S2, S3 that represent a first, second and third scan path respectively for a coarse wafer alignment. Each scan path which is parallel to the second direction D2 (to which is also referred as the alignment scanning direction) corresponds to a path taken by the centroid of the illumination beam spot on the surface of the wafer.

In the example shown in FIG. 2, the first scan S1 passes in each block line substantially over a block BL. The second scan S2 passes the scribe lane SL parallel to the first scan S1, but shifted in the first direction D1 (also referred to as alignment non-scanning direction) over a first shift DP1. The first shift DP1 corresponds to a fraction of the repeating distance (block pitch) BP.

If it is required by the method to carry out a third scan as will be explained in more detail below, the third scan S3 passes the scribe lane SL parallel to the second scan S2, but shifted in the first direction D1 over a second shift DP2. The second shift DP2 corresponds to a second fraction of the repeating distance (or block pitch) BP.

Figure 3:
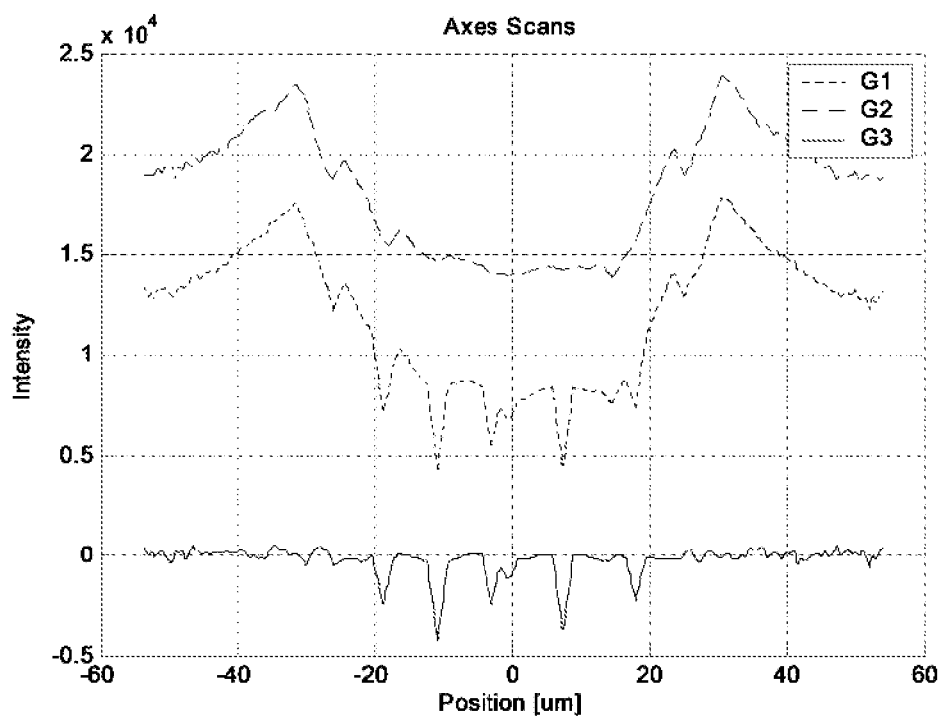
FIG. 3 depicts a first example of scan data as obtained by the method according to the present invention.

FIG. 3 depicts exemplary scan data as obtained by the method according to the present invention.

In FIG. 3, for each of the first and second scans S1, S2, the measured intensity (vertical axis) for a single wavelength is plotted as a function of the measurement position (horizontal axis) within the scribe line SL along the respective scan path in the second direction D2.

The exemplary scan data shown in FIG. 3 relate to the exemplary mark AM as described above. In this example, the diameter of the illumination beam spot is typically ~40 m. The width of the scribe lane SL in this case is 60 µm.

The first scan S I in which the centroid of the illumination beam spot passed over a block in each block line M1 ... M3 of the mark AM, produces a first interferometry signal as indicated by the dotted-line graph G1. The second scan S2 produces a second interferometry signal as indicated by dashed-line graph G2.

The dotted-line graph G1 of the first scan S1 displays some distinct local intensity minima in a interval between about −20 and +20 µm around a center value 0. The local intensity minima are caused by the interference of light diffracted from the lines M1 ... M3 of the mark AM.

At positions outside of this interval, the intensity increases due to the fact that an increasing portion of the illumination beam spot impinges on the product area and does not contribute to the interference of the mark, but only reflects on the surface. At positions smaller than about −30 and larger than about +30, the intensity decreases somewhat due some interference of the pattern in the product area C with itself Due to the intensity originating from the product area, the determination of the positions of the local intensity minima in the interferometry signal becomes inaccurate.

The dashed-line graph G2 of the second scan S2 does substantially not show an interference pattern since the centroid of the illumination beam spot passes in between the blocks in the block lines M1 ... M3. As a result of this, no interference is detected by the self referencing interferometer. It is noted that the intensity of the signal of dashed-line graph G2 as function of position corresponds to the intensity of the signal of dotted-line graph G1, except for the local intensity minima displayed in dotted-line graph G1.

According to the present invention, the method provides the determination of a first difference of the intensity of the first scan S1 and the intensity of the second scan S2. In FIG. 3, the first differential interferometry signal is shown by solid-line graph G3. The first differential interferometry signal G3 displays the local intensity minima as generated by the mark AM, while the disturbance as caused by the product area is substantially removed. As a result, the accuracy of the alignment (i.e., determining the position of the mark AM) is enhanced.

Embodiments of the present invention may allow elimination of the exclusion zone in the target portions C close to the scribe lane SL because the differential interferometry may allow a reduction the disturbance of the interferometry signal due to reflections generated by product structures. Due to the relatively small shift in the first direction between the first and the second scans, the signal produced by the product tends to be very similar in each of the first and second scans, which in the differential interferometry signal results in a substantially zero signal originated by the product.

Figure 4:
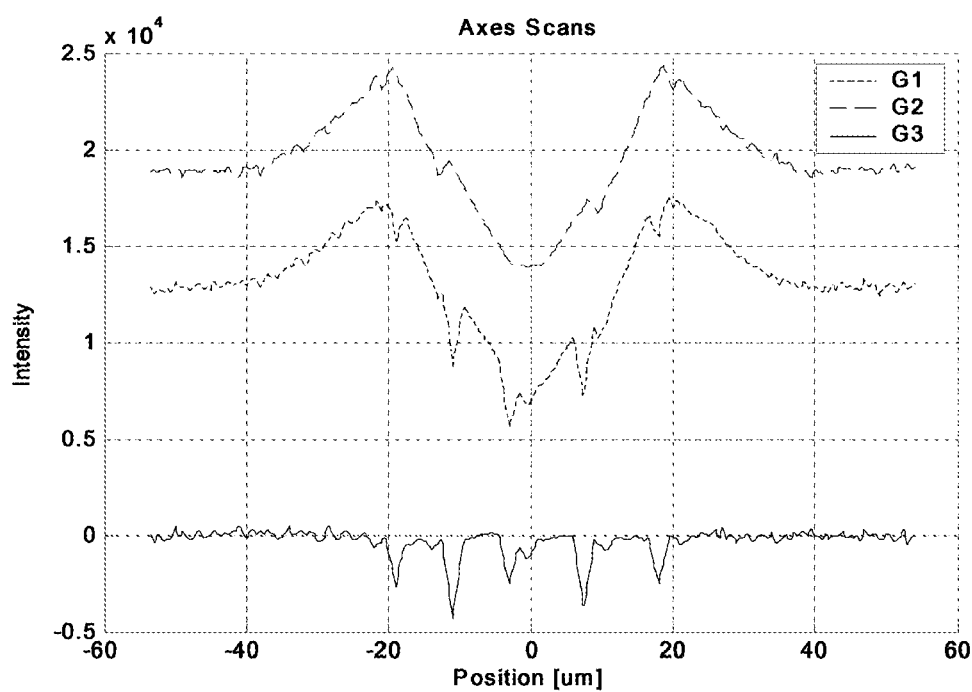
FIG. 4 depicts a second example of scan data as obtained by the method according to the present invention.

FIG. 4 depicts a second example of scan data as obtained by the method according to the present invention. The scan data depicted in FIG. 4 relate to the same mark AM as discussed with reference to FIG. 3 and which mark is located in a scribe lane SL that has a width of 40 µm. As a result, the influence of the product area C on the interferometry signal as measured by the self referencing interferometer can observed already in a smaller interval of positions.

Again, the first scan S1 a first interferometry signal as indicated by the dotted-line graph G1. The second scan S2 produces a second interferometry signal as indicated by dashed-line graph G2.

In this case, the dotted-line graph G1 of the first scan S1 displays a distinct local intensity minimum around a center value 0 of the position. At larger positive and negative position values, the intensity of the interferometry signal increases strongly to a maximum at about −20 and about +20 µm. At still larger negative and positive values the intensity of the interferometry signal decreases to a constant level at about −40 and about +40 µm, respectively. Clearly to determine from graph G1 the local intensity minima caused by the mark AM from the dotted-line graph G1 is difficult. Alignment with sufficient accuracy does not appear possible.

Again, the dashed line graph G2 has a similar envelope as the dotted line graph G1.

The first differential interferometry signal of the difference of the intensity of the first scan S1 and the intensity of the second scan S2 is shown by solid-line graph G3. The first differential interferometry signal G3 displays the local intensity minima as generated by the mark AM, while the disturbance as caused by the product area is substantially removed. As a result, the accuracy of the alignment (i.e., determining the position of the mark AM) is enhanced.

The first differential interferometry signal G3 is typically processed by a pattern recognition procedure for determining correspondence between the pattern of local intensity minima in the first differential signal G3 and the expected pattern of the mark AM.

If the check is successful, the first differential interferometry signal can be used in the alignment procedure for determining a position of the substrate in the coordinate system of the lithographic apparatus, as will be appreciated by the skilled in the art. The check may be unsuccessful, in case the first and second scans S1, S2 are not correctly positioned. For example, in both scans S1, S2 the centroid of the illumination beam spot crosses over a portion of the blocks in the lines M1 ... M3 of the mark AM or alternatively in both scans the illumination beam spot does not cross the blocks, then difference signal may not contain a detectable pattern.

However, if the check is unsuccessful (the pattern of the first differential interferometry signal can not be matched), the method provides that a third scan S3 is carried out. In the third scan path, the illumination beam spot passes the scribe lane SL parallel to the second scan S2, but shifted in the first direction D1 over a second shift DP2.

If the third scan S3 is carried out, then a second differential interferometry signal is determined as a difference between the first interferometry signal obtained during the first scan and the third interferometry signal obtained during the third scan. Also, a third differential interferometry signal is determined as a difference between the second interferometry signal obtained during the first scan and the third interferometry signal obtained during the third scan.

The second differential interferometry signal is matched with the expected pattern of the mark AM. If this check is successful, the second differential interferometry signal can be used in the alignment procedure, else the third differential interferometry signal can be used in the alignment procedure.

The first shift DP1 between the first scan S1 and the second scan S2, and the second shift DP2 between the second scan S2 and the third scan S3 are selected relative to the block pitch BP in such a way that either the first, or the second or the third differential interferometry signal will produce a successful match against the expected pattern of the mark AM.

In an embodiment, the first shift DP1 corresponds to one quarter (¼) of the block pitch BP, the second shift DP2 corresponds to one eighth (⅛) of the block pitch BP.

Figure 5:
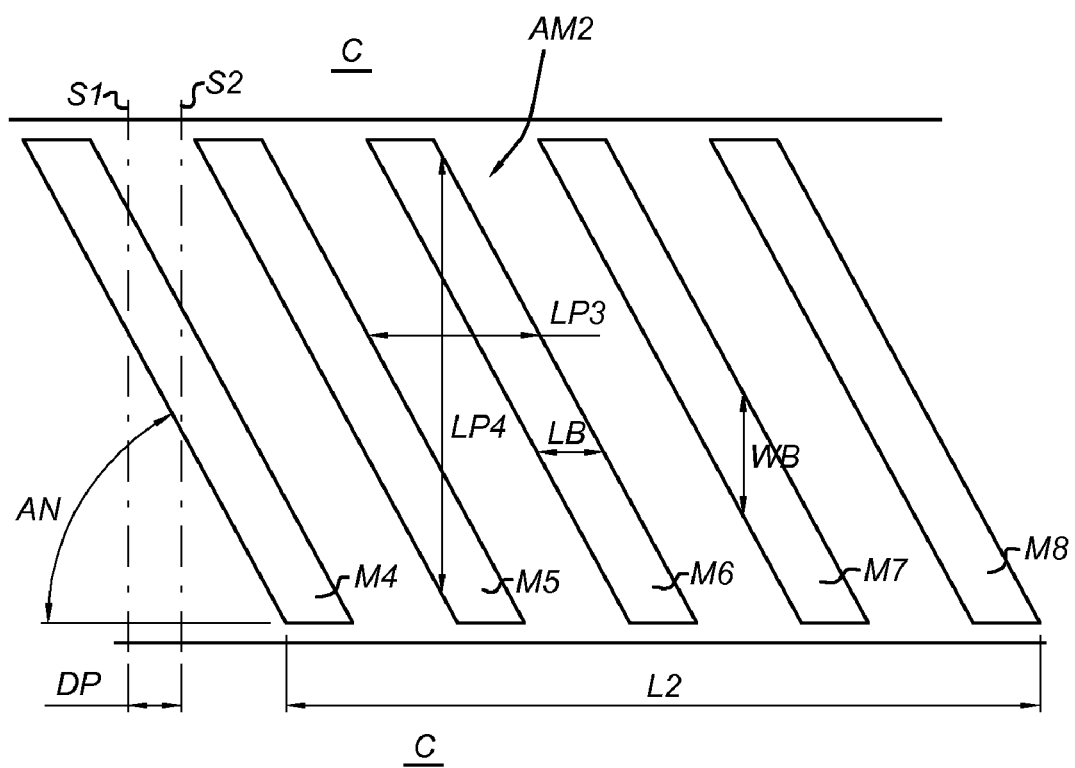
FIG. 5 depicts a top view of a mark for coarse alignment for illustration of the method according to a second embodiment of the present invention.

FIG. 5 depicts a top view of a mark for coarse alignment for illustration of the method according to a second embodiment of the present invention.

Second mark AM2 is arranged on a semiconductor wafer in a scribe line SL that is intermediate two target portions C. The scribe line SL extends longitudinally in a first direction D1, and has a width W in a second direction D2 perpendicular to the first direction D1.

The second mark AM comprises a plurality of oblique lines M4, M5, M6 ... M8 which are ranked under an oblique angle (neither zero nor perpendicular) AN relative to the first direction D1, adjacent to each other in the first direction D1 of the scribe line SL over a mark length L2.

The oblique lines M4 ... M8 are separated from each other by a periodic structure in the first direction with a repeating distance as indicated by third interspace LP3 in the first direction D1 and by a mark structure in the second direction as indicated by fourth interspace LP4 in the second direction D2.

Each line has a first width LB in the first direction D1 and a second width WB in the second direction D2.

In an exemplary second mark AM2, the width W of the scribe lane SL is 60 µm, the third pitch LP3 is 4 µm, the fourth pitch LP4 is 4 µm, the first width LB is sqrt(2)*2 µm=2.828 µm and the second width WB is sqrt(2)*2 µm=2.828 µm. (in this case the angle AN is choosen 45 degrees)

During an optical alignment scan, the illumination beam of the self referencing interferometer is provided as a spot on the substrate, for illuminating the second mark AM2.

The second mark AM2 is arranged for producing an optical interference pattern during the optical alignment scan in which the optical interference pattern displays a number of individual local intensity minima.

The method according to the second embodiment of the present invention is illustrated by dotted lines S1, S2 that represent a first, and second scan path respectively for a coarse wafer alignment. Each scan path which is parallel to the second direction D2 (to which is also referred as the alignment scanning direction) corresponds to a path taken by the centroid of the illumination beam spot on the surface of the wafer.

In the example shown in FIG. 5, the first scan S1 starts in or close to the upper product area C and traverses the scribe lane SL. First, the first scan passes oblique line M5 and next, passes oblique line M4. Finally, the first scan S1 ends close to, or in the lower product area C.

Next, a second scan S2 is performed. The second scan S2 is shifted in the first direction D1 (also referred to as alignment non-scanning direction) over a first shift DP1 (which equals a fraction of the repeating distance of the periodic structure in the first direction) and passes the scribe lane SL parallel to the first scan S1: the second scan S2 starts in or close to the upper product area C and traverses the scribe lane S. First, the second scan S2 passes oblique line M5 and next, passes oblique line M4. Finally the second scan S2 ends close to, or in the lower product area C.

In this embodiment, the first shift DP1 corresponds to a fraction (ideally ¼) of the third pitch LP3 as repeating distance.

In this second embodiment, there is no requirement to carry out a third scan, because both scans S1, S2 can always be chosen out of phase relative to each other due to the coupling of the periodicity and the mark structure of the mark in the non-scanning direction D1 and scanning direction D2, respectively.

Figure 6:
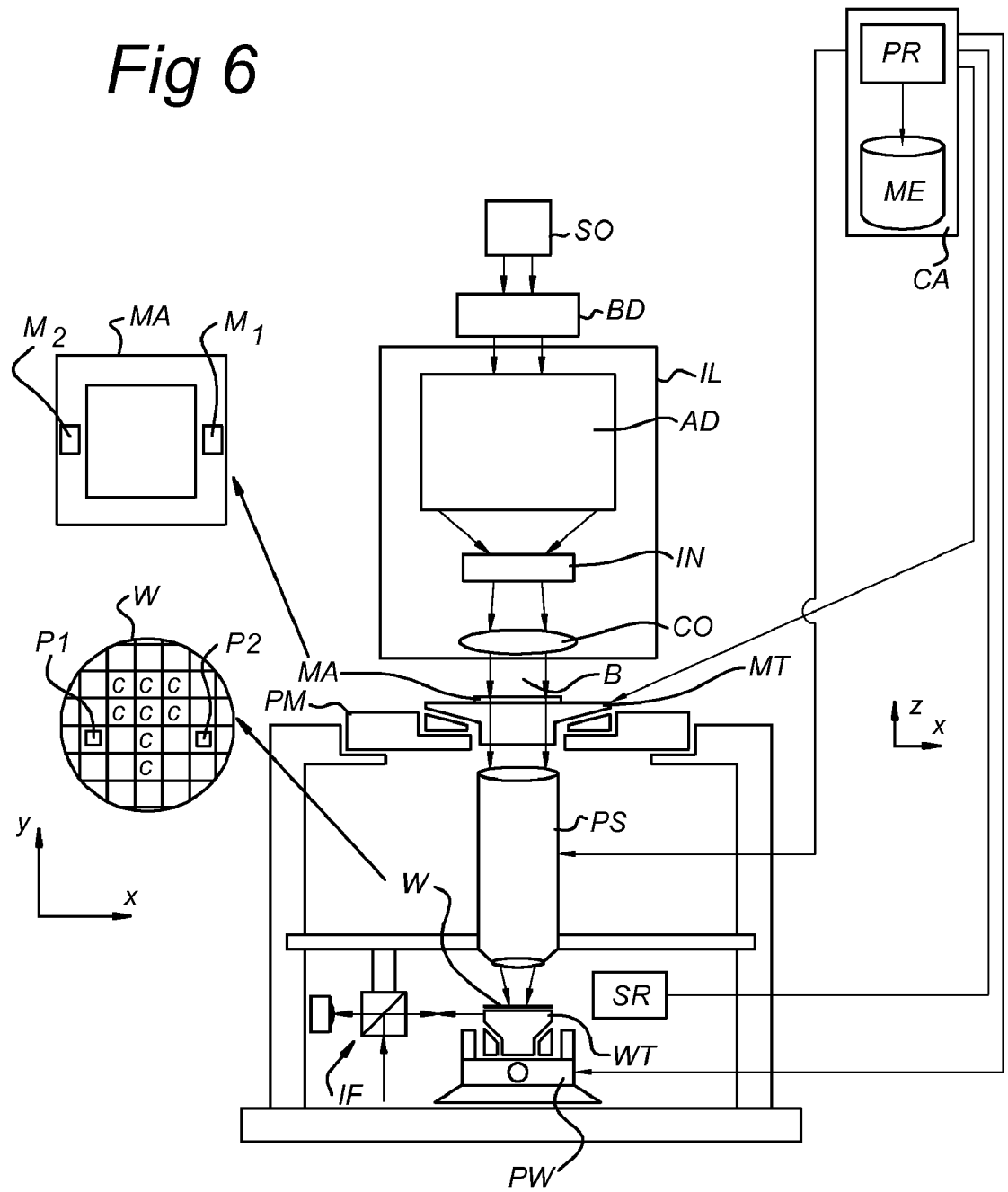
FIG. 6 shows an embodiment of the lithographic apparatus in accordance with the present invention.

FIG. 6 shows an embodiment of the lithographic apparatus. The lithographic apparatus comprises a scanning device, a self referencing interferometer and a control system CA.

For reason of clarity, the scanning device and the self referencing interferometer are depicted here by a single block SR. In practice, the scanning device and the self referencing interferometer may be two separate devices or alternatively may be integrated into one scanning apparatus.

The control system CA is coupled to the substrate table WT, the self referencing interferometer and the scanning device for controlling an action of the substrate table, the self referencing interferometer and the scanning device, respectively.

The scanning device is configured to provide an illumination beam for scanning the mark in the second direction. The self referencing interferometer is capable of detecting a interferometry signal from a pattern on the surface of the semiconductor wafer, for example the mark AM. It is noted that the self referencing interferometer is sensitive to so-called 180° point symmetry elements in the pattern.

The control system comprises a computer arrangement CA comprising a processor PR for performing arithmetical operations, and a memory ME.

It will be understood that the method described above may be carried out by a lithographic apparatus comprising such a control system. This is schematically depicted in FIG. 5, showing an example of the lithographic apparatus now further comprising the processor PR being arranged to communicate with memory ME. Memory ME may be any type of memory arranged to store instructions and data, such as a tape unit 13, hard disk 14, a Read Only Memory (ROM) 15, Electrically Erasable Programmable Read Only Memory (EEPROM) 16 and a Random Access Memory (RAM) 17.

The processor PR may be arranged to read and execute programming lines stored in memory ME providing the processor PR with the functionality to perform an embodiment of the method described above.

In order to be able to carry out an embodiment of the method, the processor PR is connected to the self referencing interferometer SR for receiving interferometry signals corresponding to the first scan S1 and second scan S2, and if required the third scan S3. Note that the self referencing interferometer SR is shown schematically as a block adjacent to the wafer stage WT, but may be located at a different position as will be appreciated by the skilled in the art.

Further the processor PR may be arranged to control at least one of the position of the mask table MT, the position of the substrate table WT, the source SO, the illuminator IL, the projecting system PS and possible further components of the lithographic apparatus.

The processor PR may be specially provided as a dedicated processor to perform the described method, but may also be a central processor arranged to control the lithographic apparatus as a whole and now being provided with additional functionality to perform an embodiment of the described method.

It should be understood that there may be provided more and/or other units, such as memory units, input devices and read devices known to persons skilled in the art. Moreover, one or more of them may be physically located remote from the processor PR, if required. The processor PR is shown as one box, however, it may comprise several processing units functioning in parallel or controlled by one main processor PR that may be located remote from one another, as is known to persons skilled in the art.

It is observed that, although all connections in FIG. 5 are shown as physical connections, one or more of these connections can be made wireless. They are only intended to show that "connected" units are arranged to communicate with one another in someway. The computer system can be any signal processing system with analog and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (a computer readable medium, e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. Method for alignment of a substrate, the substrate comprising a mark in a scribe lane, the scribe lane extending along a longitudinal direction as a first direction, the mark having a periodic structure in the first direction and a mark structure extending in a second direction perpendicular to the first direction, the periodic structure having a repeating distance in the first direction, the method comprising:

providing an illumination beam for scanning the mark in the second direction;

scanning a spot of the illumination beam in the second direction along a first scan path across the mark;

scanning the spot of the illumination beam in the second direction along a second scan path across the mark, the second scan path being parallel to the first scan path, wherein the second scan path is shifted along the first direction relative to the first scan path over a first shift, the first shift corresponding to a fraction of the repeating distance of the periodic structure in the first direction.

2. A method according to claim 1, wherein the mark comprises a plurality of lines, the lines extending in the first direction and being arranged parallel to each other, each one of the plurality of lines being divided in a plurality of blocks in a substantially identical manner, the repeating distance of the periodic structure being defined by a spacing of the blocks in each line in the first direction; the mark structure in the second direction being defined by an interspace between each pair of lines selected from the plurality of lines.

3. A method according to claim 2, wherein the plurality of lines comprises at least three lines.

4. A method according to claim 1, wherein the plurality of lines comprises a set of oblique lines which are each ranked under an oblique angle relative to the first direction; the repeating distance of the periodic structure being defined by a spacing between each pair of lines in the first direction, and wherein the mark structure in the second direction is defined by an interspace between the lines in the second direction.

5. A method according to claim 1, further comprising:
registering by a self referencing interferometer of a first interferometry signal obtained during the scanning along the first scan path;
registering by the self referencing interferometer of a second interferometry signal obtained during the scanning along the second scan path;
determining a first differential interferometry signal from the first interferometry signal and the second interferometry signal.

6. A method according to claim 5, further comprising:
matching a pattern of the first differential interferometry signal with an expected pattern corresponding to the mark.

7. A method according to claim 6, wherein:
if the pattern in the first differential interferometry signal does not match with the expected pattern of the mark, the method further comprises:
scanning a spot of the illumination beam along a third scan path across the mark, the third scan path being parallel to the first scan path and is shifted relative to the first scan path over a second shift, the second shift corresponding a second fraction of the repeating distance of the periodic structure in the first direction, and
registering by the self referencing interferometer of a third interferometry signal obtained during the scanning along the third scan path.

8. A method according to claim 7, wherein the first differential interferometry signal is used for determining a position of the substrate in a wafer alignment procedure in a lithographic apparatus.

9. A method according to claim 7, further comprising:
determining a second differential interferometry signal from the first interferometry signal and the third interferometry signal;
matching a pattern of the second differential interferometry signal with the expected pattern corresponding to the mark; and
if the pattern in the second differential interferometry signal does not match with expected pattern of the mark:
determining a third differential interferometry signal from the first interferometry signal and the third interferometry signal;
matching a pattern of the third differential interferometry signal with the expected pattern corresponding to the mark.

10. A method according to claim 9, wherein one interferometry signal selected from the second and third differential interferometry signals is used for determining a position of the substrate in a wafer alignment procedure in a lithographic apparatus.

11. A lithographic apparatus comprising:
a substrate table constructed to hold a substrate, the substrate comprising a mark in a scribe lane, the scribe lane extending along a longitudinal direction as a first direction, the mark having a periodic structure in the first direction and a mark structure extending in a second direction perpendicular to the first direction, the periodic structure having a repeating distance in the first direction;
a scanning device for providing an illumination beam for scanning the mark in the second direction; and
a control system coupled to the substrate table and the scanning device for controlling an action of the substrate table and the scanning device, respectively, wherein the control system is configured to control:
providing an illumination beam for scanning the mark in the second direction;
scanning a spot of the illumination beam in the second direction along a first scan path across the mark; and
scanning the spot of the illumination beam in the second direction along a second scan path across the mark, the second scan path being parallel to the first scan path, wherein the second scan path is shifted along the first direction relative to the first scan path over a first shift, the first shift corresponding to a fraction of the repeating distance of the periodic structure in the first direction.

12. A lithographic apparatus according to claim 11, wherein the control system further comprises a self referencing interferometer constructed for registering of a interferometry signal obtained by the scanning device, the control system being coupled to the self referencing interferometer for controlling an action of the self referencing interferometer, wherein the control system is configured to control:
registering of a first interferometry signal obtained during the scanning along the first scan path;
registering of a second interferometry signal obtained during the scanning along the second scan path; and
determining a first differential interferometry signal from the first interferometry signal and the second interferometry signal.

13. A computer program stored on a non-transitory medium to be loaded by a computer, the computer comprising a processor, memory, the memory being connected to the processor, the computer being part of a lithographic apparatus, the lithographic apparatus comprising:
a substrate table constructed to hold a substrate, the substrate comprising a mark in a scribe lane, the scribe lane extending along a longitudinal direction as a first direction, the mark having a periodic structure in the first direction and a mark structure extending in a second direction perpendicular to the first direction, the periodic structure having a repeating distance in the first direction;
a scanning device for providing an illumination beam for scanning the mark in the second direction; and
the computer being arranged as a control system coupled to the substrate table and the scanning device for controlling actions of the substrate table and the scanning device, respectively;
the computer program after being loaded allowing the processor to carry out:
providing an illumination beam for scanning the mark in the second direction;
scanning a spot of the illumination beam in the second direction along a first scan path across the mark; and
scanning the spot of the illumination beam in the second direction along a second scan path across the mark, the second scan path being parallel to the first scan path, wherein the second scan path is shifted along the first direction relative to the first scan path over a first shift, the first shift corresponding to a fraction of the repeating distance of the periodic structure in the first direction.

14. A computer program stored on a non-transitory medium according to claim 13, wherein the computer program further includes machine-executable instructions for:
registering of a first interferometry signal obtained during the scanning along the first scan path;

registering of a second interferometry signal obtained during the scanning along the second scan path;
determining a first differential interferometry signal from the first interferometry signal and the second interferometry signal.

15. A non-transitory computer readable medium comprising a computer program according to claim 13.

* * * * *